United States Patent
Mangione et al.

(10) Patent No.: US 9,516,772 B2
(45) Date of Patent: Dec. 6, 2016

(54) TABLE-MOUNTED CORD RETRACTOR

(71) Applicant: MARSHALL FURNITURE, INC., Antioch, IL (US)

(72) Inventors: Richard M. Mangione, Grayslake, IL (US); James J. Schaffroth, Jr., Lake Villa, IL (US)

(73) Assignee: Marshall Furniture, Inc., Antioch, IL (US)

( * ) Notice: Subject to any disclaimer, the term of this patent is extended or adjusted under 35 U.S.C. 154(b) by 0 days.

(21) Appl. No.: 14/919,065

(22) Filed: Oct. 21, 2015

(65) Prior Publication Data

US 2016/0205797 A1 Jul. 14, 2016

Related U.S. Application Data

(60) Provisional application No. 62/103,362, filed on Jan. 14, 2015.

(51) Int. Cl.
| | |
|---|---|
| *H05K 5/02* | (2006.01) |
| *B65H 75/44* | (2006.01) |
| *B65H 75/48* | (2006.01) |
| *H05K 5/03* | (2006.01) |

(52) U.S. Cl.
CPC .......... *H05K 5/0217* (2013.01); *B65H 75/446* (2013.01); *B65H 75/48* (2013.01); *H05K 5/0226* (2013.01); *H05K 5/0247* (2013.01); *H05K 5/03* (2013.01)

(58) Field of Classification Search
USPC ........................................................ 174/535
See application file for complete search history.

(56) References Cited

U.S. PATENT DOCUMENTS

| | | | |
|---|---|---|---|
| 5,421,530 A * | 6/1995 | Bertagna | B65H 75/368 242/388.91 |
| 5,495,996 A | 3/1996 | Sakamoto et al. | |

(Continued)

FOREIGN PATENT DOCUMENTS

| | | |
|---|---|---|
| EP | 0629026 B1 | 9/1997 |
| EP | 2248230 B1 | 4/2014 |

*Primary Examiner* — William H Mayo, III
*Assistant Examiner* — Krystal Robinson
(74) *Attorney, Agent, or Firm* — Jansson Munger McKinley & Kirby Ltd.

(57) ABSTRACT

A table-mounted cord retractor for cord storage includes a frame with a first end from which a cord extends, a second end, and a pair of opposed, spaced sidewalls. The cord retractor also includes a sled slidably engageable between the sidewalls for movement therealong and a pulley mount slidable along the sled and spring-biased toward the second end, a pulley journaled to the pulley mount, and at least one cord-retainer adjacent to the pulley mount; a retractable pull tether at the second end of the frame having a tether line extending toward the first end to attachment with the sled; and an electronic cord having a proximal end portion adjustably clamped by the cord manager. The cord has a length to be stored in or extended from the frame depending on the needs of a user.

10 Claims, 7 Drawing Sheets

(56) References Cited

U.S. PATENT DOCUMENTS

| | | | |
|---|---|---|---|
| 6,143,985 A * | 11/2000 | Knapp | H02G 11/00 174/69 |
| 6,216,834 B1 * | 4/2001 | Steinhovden | B65H 75/368 191/12 R |
| 7,032,728 B2 | 4/2006 | Harcourt | |
| 8,387,763 B2 | 3/2013 | Burke et al. | |
| 8,469,303 B2 | 6/2013 | Feldstein et al. | |
| 8,469,305 B2 | 6/2013 | Feldstein et al. | |
| 2002/0040945 A1 | 4/2002 | Stepancich et al. | |
| 2006/0046561 A1 | 3/2006 | Lam et al. | |
| 2012/0048983 A1 * | 3/2012 | Bianco | B60L 11/1818 242/388.9 |
| 2012/0175452 A1 * | 7/2012 | Feldstein | B65H 75/368 242/381 |
| 2014/0109630 A1 | 4/2014 | Tao | |

\* cited by examiner

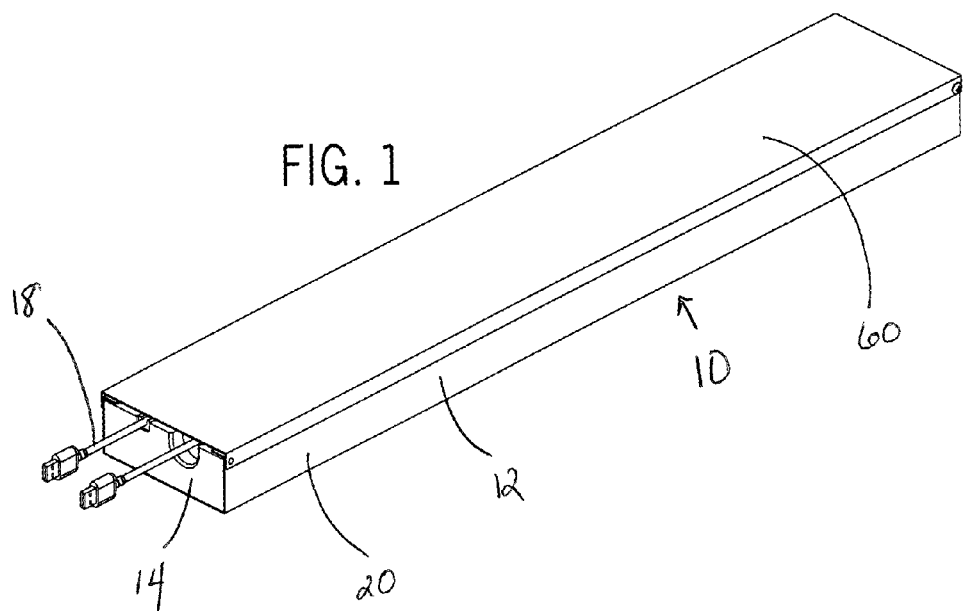
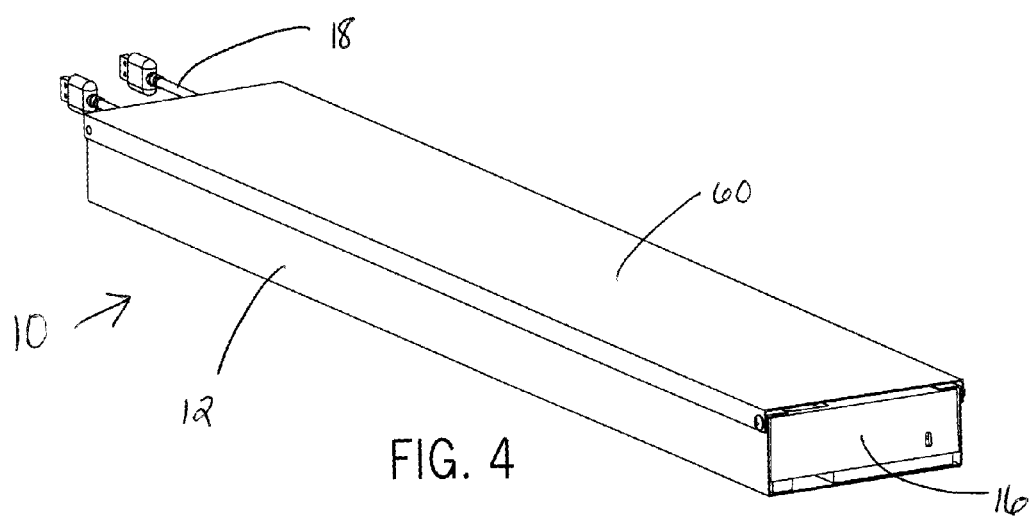

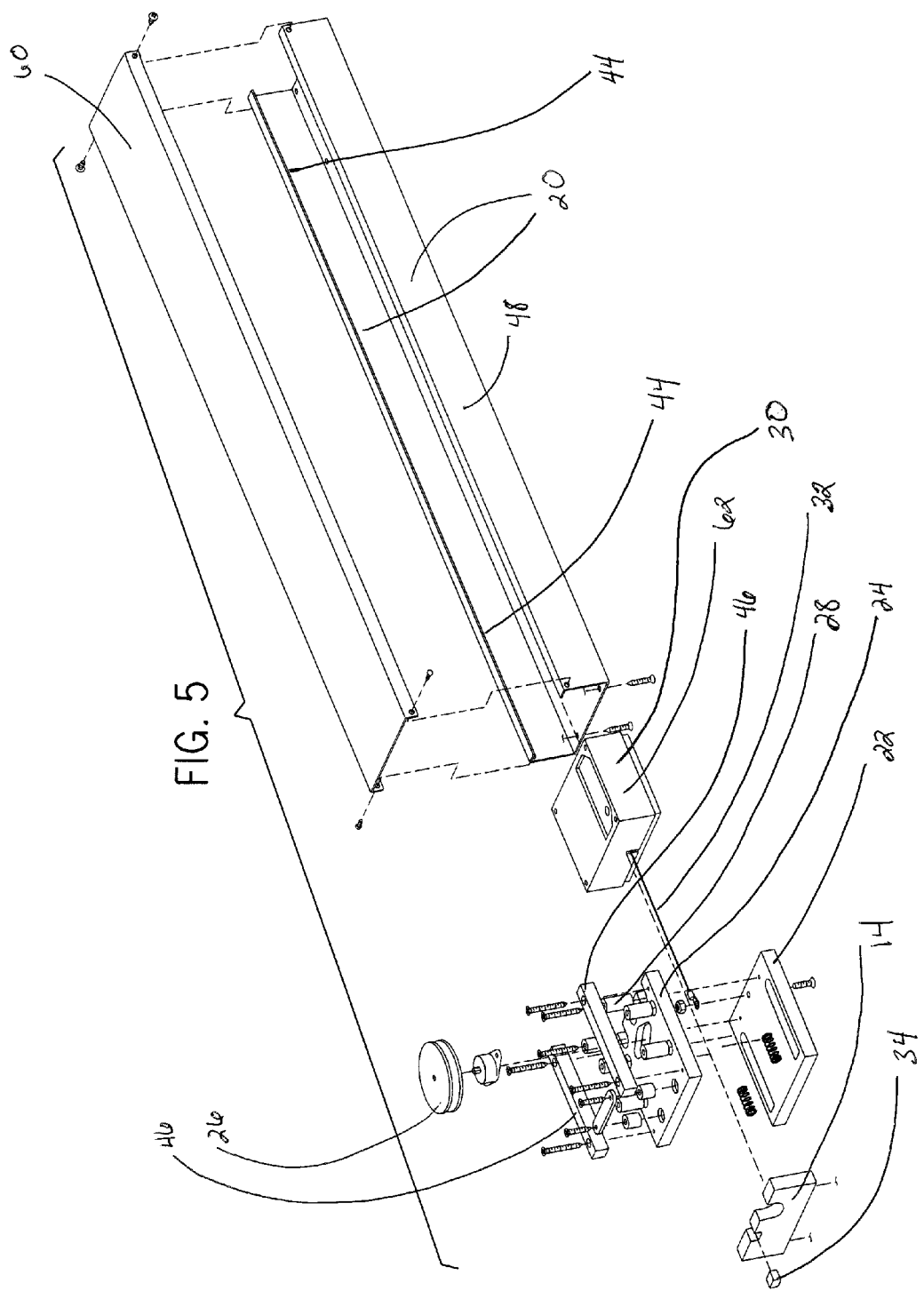

TABLE-MOUNTED CORD RETRACTOR

RELATED APPLICATION

This application claims the benefit of U.S. Provisional Application No. 62/103,362 filed on Jan. 14, 2015, the contents of which is incorporated by reference herein in its entirety.

FIELD OF THE INVENTION

This invention is related generally to storage of cords and more particularly to cord retractors which are table mounted.

BACKGROUND OF THE INVENTION

Cord retractor devices have been utilized for a variety reasons. In most cases various types of cord retractors are used simply for storage. Most of these devices are large, cumbersome and prone to failure over time given the structural parts required for the constant winding and unwinding motions. Additionally, most of the cord retractors of the prior art are hand held and must be cranked to wind up the cord. Most cord retractors are also unable to be mounted to furniture given their circular shape and the fact that they have to be hand wound.

Examples of cord retractor devices that are handheld and unable to be mounted to furniture as well as retractors which are cumbersome are disclosed in the following United States patents and applications: U.S. Pat. No. 5,495,996 (Sakamoto, et al.), U.S. Pat. No. 8,495,996 (Burke, et al.) and Patent Application Nos. 2006/0046561 (Lam, et al.) and 2014/0109630 (Tao).

Given the above, there are a number of shortcomings with cord retractors of the prior art. There is a need for a cord retractor which is compact, easy to use and able to be securely mounted to the underside of a table or podium or other piece of furniture. Therefore, it would be desirable to have a cord retractor that meets these needs and provides a solution for such need in the industry.

A wide variety of cord retractors have been created and are available. However, there is a need for improvement in cord retractors, and it is to this need that this device is directed. This device overcomes certain problems and shortcomings in the prior art, including those mentioned above and others by namely providing an improved table-mounted cord retractor.

SUMMARY OF THE INVENTION

In accordance with the present device, a table-mounted cord retractor is provided. The cord retractor of this application overcomes certain problems and shortcomings of the prior art and provides a unique structure satisfying storage concerns.

The table-mounted cord retractor includes a frame with a first end from which a cord extends, a second end, and a pair of opposed, spaced sidewalls extending therebetween; a sled slidably engageable between the sidewalls for movement therealong and having a pulley mount slidable along the sled and spring-biased toward the second end, a pulley journaled to the pulley mount, and at least one cord-retainer adjacent to the pulley mount; a retractable pull tether at the second end of the frame having a tether line extending toward the first end to attachment with the sled; a cord manager secured with respect to the frame at the first end; and electronic cord having a proximal end portion adjustably clamped by the cord manager, a middle portion extending to and around the pulley and back toward the first end, and a retractable distal end portion extending to and beyond the first end, the cord having a length to be stored in or extended from the frame depending on the needs of a user.

In highly preferred embodiments, the opposed sidewalls each have a slot therealong, the sled has slot-engagers which are slidable therealong.

It is also highly preferred that the frame is a housing and that the housing includes a mounting wall supporting the spaced sidewalls and having a planar upper surface for engagement with the underside of a table. Preferably, mounting wall provides a planar surface but doesn't have to be continuous in nature. It is also preferable that the mounting wall includes at least one securing member for engagement with the underside of a table. In some embodiments, the at least one securing member is a planar adherence member. In other embodiments, the planar adherence member is a hook-and-loop-type member.

In certain preferred embodiments the housing includes a hinged cover substantially parallel to and spaced from the mounting wall. The hinged cover allows access to components within the housing.

In some preferred embodiments the retractable pull tether is a tether box at the second end of the frame. Preferably, the cord manager includes a clamp to clamp the proximal end portion of the cord as well as a guide aperture adjacent thereto through which the distal end portion passes.

The term "bottom" as used herein means a side and is not limited to the lower or underside.

The term "housing" as used herein means support for the inventive mechanism, it is essential that it provide mounting capability for functional elements but does not have to be of a closed nature.

A wide variety of cord retractors have been created and are available. However, there is a need for improvement in the nature of table-mounted cord storage, and it is to this need that this device is directed.

BRIEF DESCRIPTION OF THE DRAWINGS

The drawings illustrate a preferred embodiment including the above-noted characteristics and features of the device. The device will be readily understood from the description and drawings. In the drawings:

FIG. 1 is a perspective view of the cord retractor with the cover in the closed position;

FIG. 4 is a back perspective view of the cord retractor of FIG. 1 with the cover in the closed position;

FIG. 5 is an exploded view of the cord retractor of FIG. 1;

DETAILED DESCRIPTION OF PREFERRED EMBODIMENTS

Figure 2:
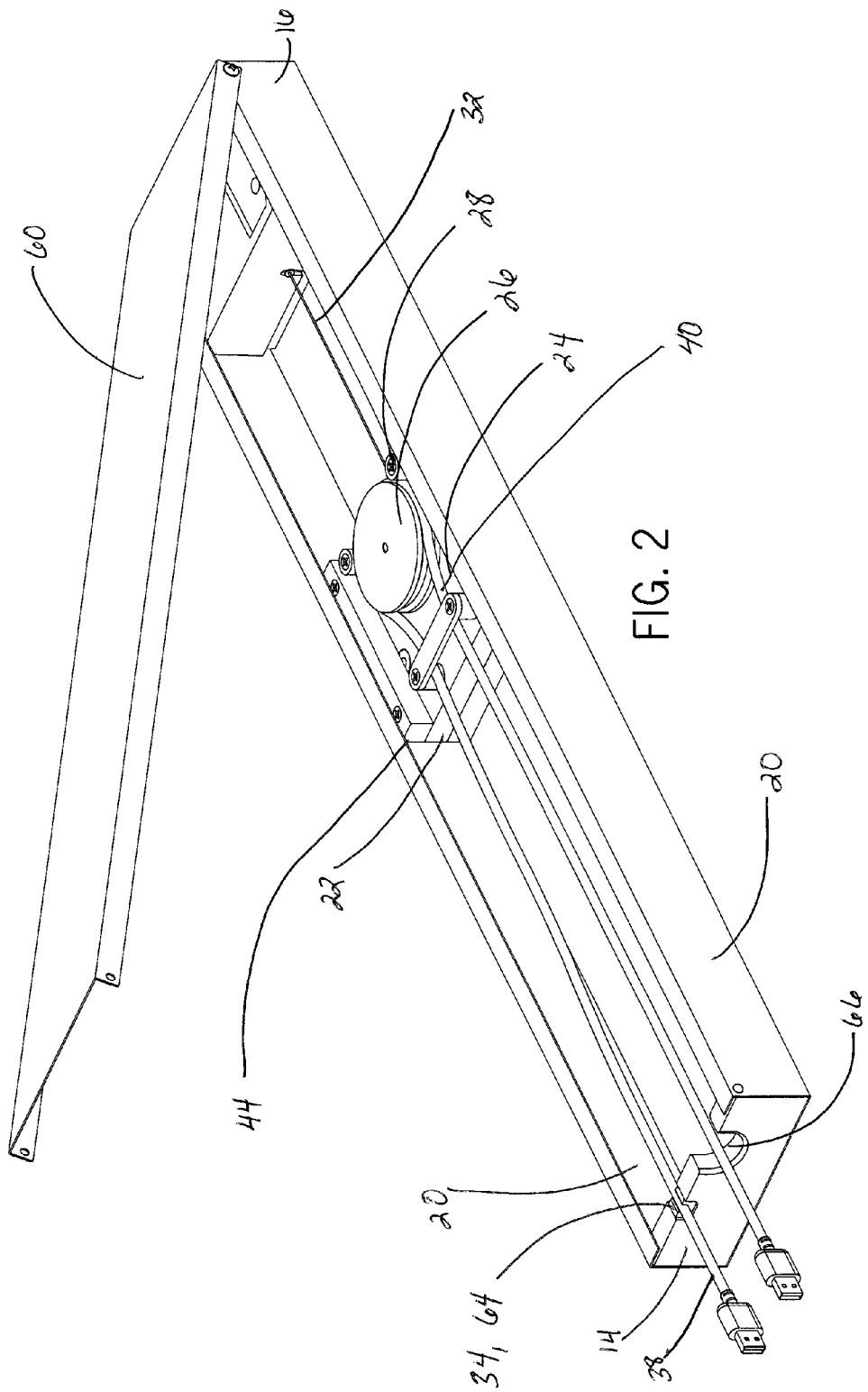
FIG. 2 is a perspective view of the cord retractor of FIG. 1 with the cover in the open position and illustrating the sled.
Figure 3A:
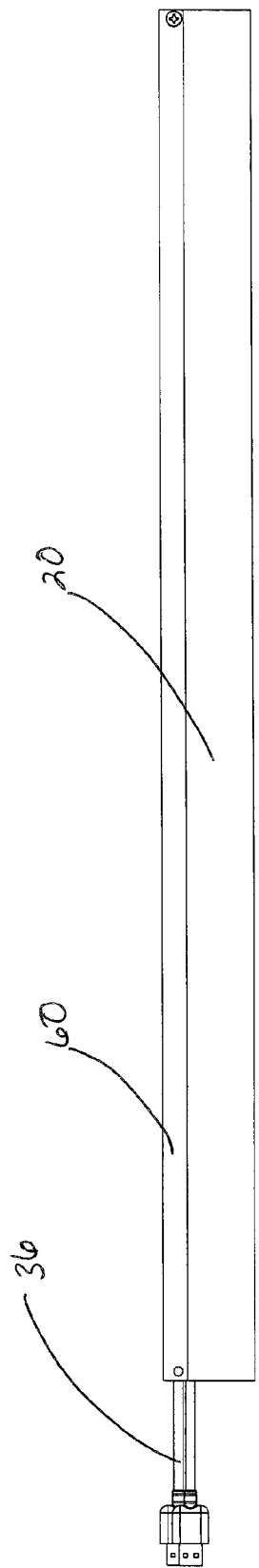
FIGS. 3A and 3B are side views of the cord retractor of FIG. 1.
Figure 3B:
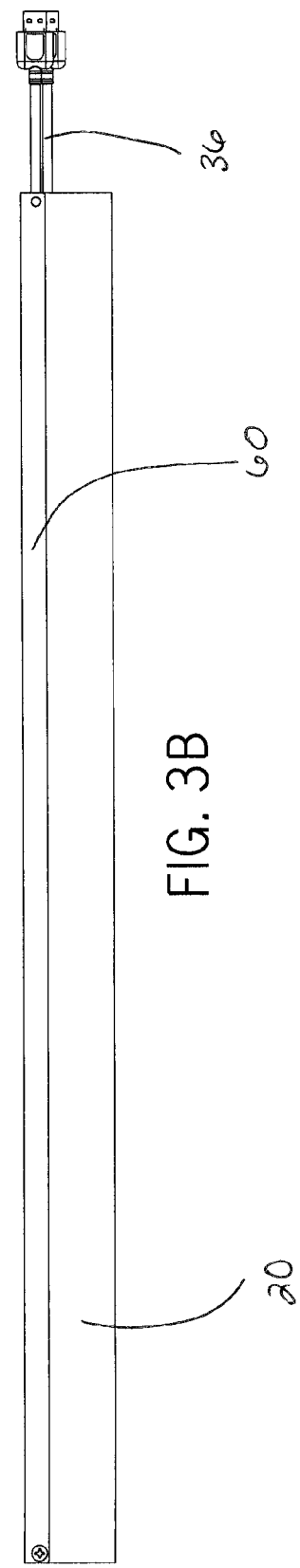

FIGS. 1-8 illustrate that table-mounted cord retractor 10 includes a frame 12 with a first end 14 from which a cord 18 extends, a second end 16, and a pair of opposed, spaced sidewalls 20 extending therebetween; a sled 22 slidably engageable between the sidewalls 20 for movement therealong and having a pulley mount 24 slidable along the sled 22 and spring-biased toward the second end 16, a pulley 26 journaled to the pulley mount 24, and at least one cord-retainer 28 adjacent to the pulley mount 24; a retractable pull tether 30 at the second end 16 of the frame 12 having a tether line 32 extending toward the first end 14 to attachment with the sled 22; a cord manager 34 secured with respect to the frame 12 at the first end 14; and electronic cord 36 having a proximal end portion 38 adjustably clamped by the cord manager 34, a middle portion 42 extending to and around the pulley 26 and back toward the first end 14, and a retractable distal end portion 40 extending to and beyond the first end 14, the cord 36 having a length to be stored in or extended from the frame 12 depending on the needs of a user.

Figure 8:
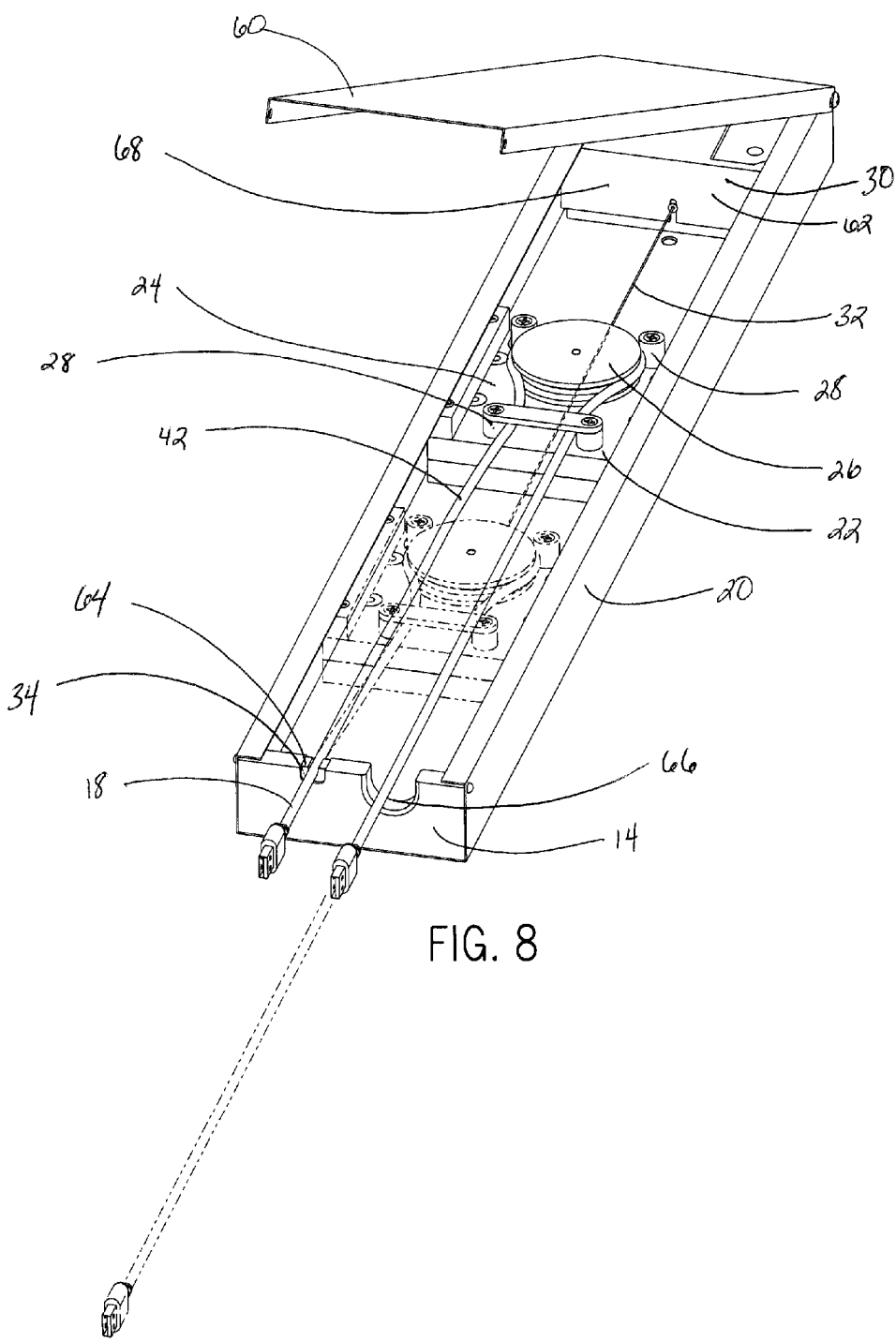
FIG. 8 is a perspective view of the cord retractor of FIG. 1 with the cover in the open position and illustrating the sled movement.

As seen in FIGS. 2, 5 and 8, opposed sidewalls 20 each have a slot 44 therealong. Sled 22 has slot-engagers 46 which are slidable therealong.

FIGS. 1-8 illustrate that frame 12 is a housing and that the housing 48 includes a mounting wall 50 supporting the spaced sidewalls 20 and having a planar upper surface 52 for engagement with the underside 54 of a table 56. Frame 12 can be made of various metal and plastic materials as can any of the other components in the cord retractor 10. As seen in the figures, mounting wall 50 provides a planar surface but does not have to be continuous in nature.

Figure 7:
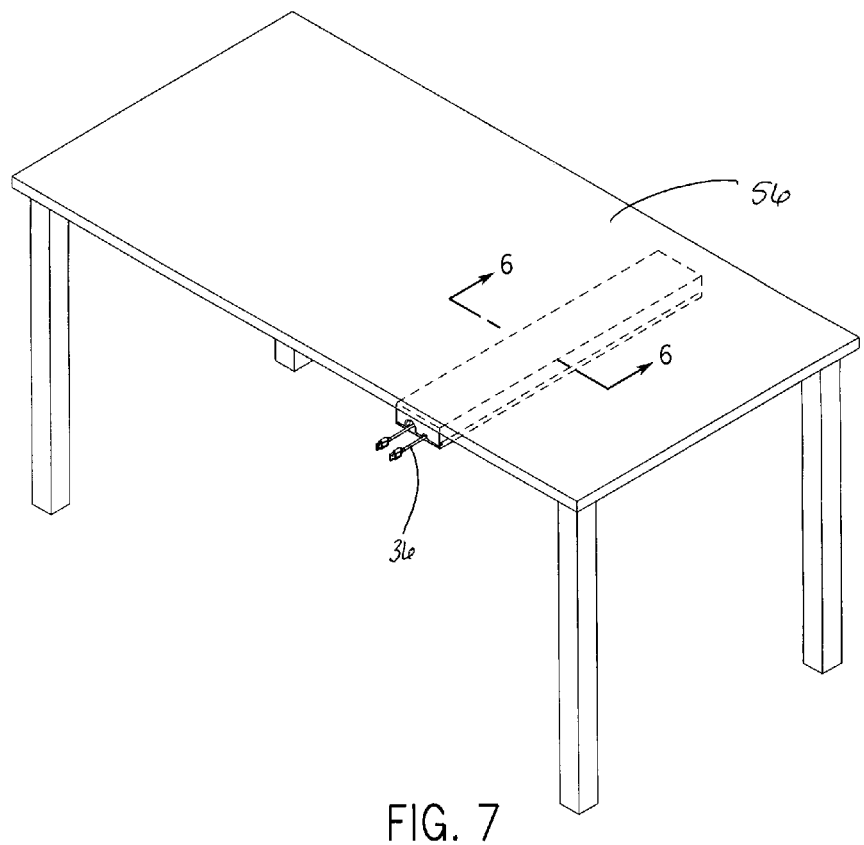
FIG. 7 is a perspective view of the cord retractor mounted to the underside of a table.
Figure 7A:
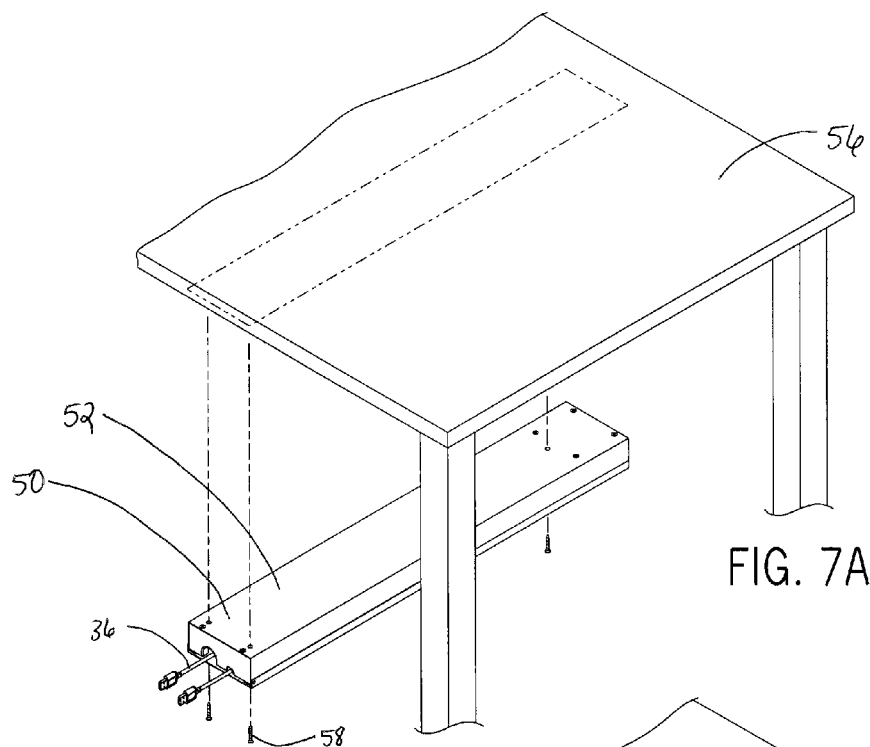
FIG. 7A is a perspective view of the cord retractor of FIG. 1 with the securement member.
Figure 7B:
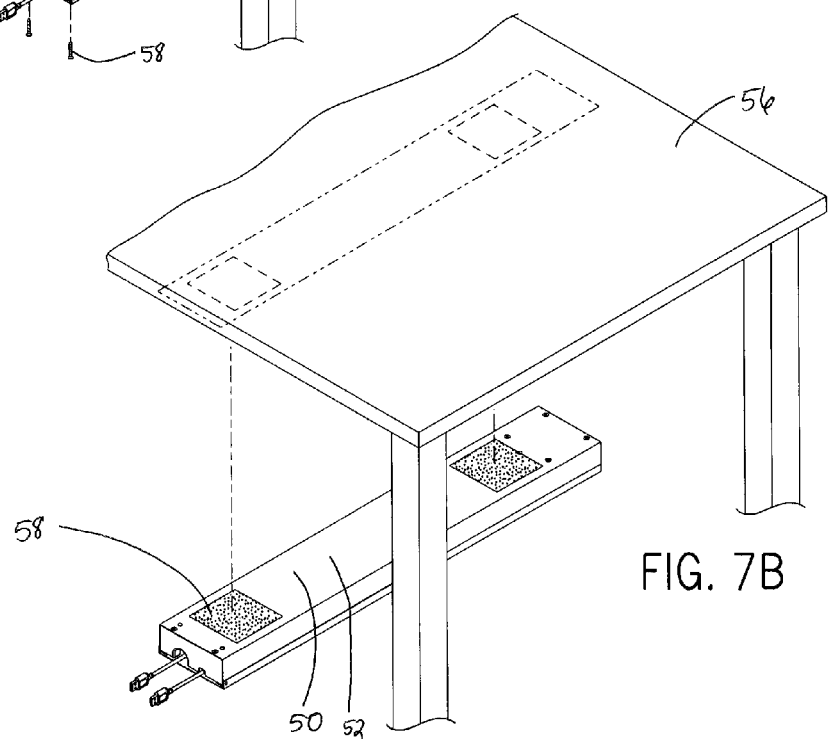
FIG. 7B is a perspective view of the cord retractor of FIG. 1 with a planar adherence member or a hook-and-loop-type member.

As seen best in FIGS. 7A-7B, mounting wall 50 includes at least one securing member 58 for engagement with the underside 54 of a table 56 such as bolts or screws. In some embodiments, the at least one securing member 58 is a planar adherence member. In other embodiments, the planar adherence member is a hook-and-loop-type member as seen in FIG. 7B.

Housing 48 includes a hinged cover 60 substantially parallel to and spaced from the mounting wall 50 as illustrated in FIGS. 2 and 8. Hinged cover 60 allows access to components within the housing 48. Cover 60 can be hinged to any side of frame 12 and is not limited to what is shown in the figures.

In some embodiments retractable pull tether 30 is a tether box 62 at the second end 16 of the frame 12 as seen in FIGS. 2 and 8. Pull tether 30 and tether box 62 can be various sizes depending on the strength of pull tether 30.

As seen in FIGS. 1 and 5, cord manager 34 includes a clamp 64 to clamp the proximal end portion 38 of the cord 36 as well as a guide aperture 66 adjacent thereto through which the distal end portion 40 passes.

All components within the frame 12 are easily accessible and no tools are needed to thread a cord 36 into the cord retractor 10. The motion control device in the sled 22 is on a ratchet and moves like a window shade.

In some embodiments, pulley mount 24 on sled 22 is directly attached to a motion resistance controller 68 that prevents the sled 22 from snapping back abruptly. Controller 68 can be a rotary shock absorber and pulley 26 is mounted on its shaft. By integrating the pulley 26 and the motion controller 68, a separate system to restrain the sled 22 from snapping back uncontrollably is avoided.

Figure 6:
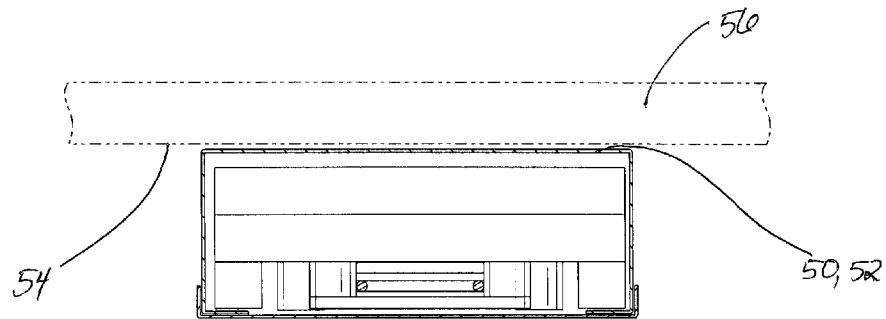
FIG. 6 is a cross-sectional view of the cord retractor mounted to the underside of a table taken along line 6-6 of FIG. 7.

Cord retractor 10 is preferably for low voltage power cords. The design allows for little or no tension on the cables. Cord retractor 10 can install under a table or other pieces of furniture like a podium as seen in FIGS. 6-7B. Cord retractor 10 provides power cord storage in a conference table, podium or other similar piece of furniture that can be installed and removed from service without any tools. Cord retractor 10 can be installed at any convenient angle and can be of variable lengths. No tools are required to load or unload a factory stock or custom power cable from the cord retractor 10 in the field. Cord retractor 10 is a self adjusting, spring-loaded system which allows for cords of different thicknesses to be installed with no manual adjustments. This makes it possible to switch from one type of computer to another easily. The design of cord retractor 10 puts little to no strain on fragile power cords. Once installed under a desk or podium, cord retractor 10 is not readily visible due to its slim profile. Multiple cord retractor units may be installed in applications such as under conference tables to allow numerous individuals at the table access to a cable.

A wide variety of materials are available for the various parts discussed and illustrated herein. While the principles of this invention have been described in connection with specific embodiments, it should be understood clearly that these descriptions are made only by way of example and are not intended to limit the scope of the invention.

The invention claimed is:

1. A table-mounted cord retractor apparatus comprising:
 a frame with a first end from which a cord extends, a second end, and a pair of opposed, spaced sidewalls extending therebetween;
 a sled slidably engageable between the sidewalls for movement therealong and having a pulley mount slidable along the sled and spring-biased toward the second end, a pulley journaled to the pulley mount, and at least one cord-retainer adjacent to the pulley mount;
 a stationary pull tether-box at the second end of the frame having a retractable tether line extending toward the first end to attachment with the sled;
 a cord manager secured with respect to the frame at the first end; and
 an electronic cord having a proximal end portion adjustably clamped by the cord manager, a middle portion extending to and around the pulley and back toward the first end, and a retractable distal end portion extending to and beyond the first end, the cord having a length to be stored in or extended from the frame depending on the needs of a user.

2. The cord retractor apparatus of claim 1 wherein the opposed sidewalls each have a slot therealong, the sled having slot-engagers slidable therealong.

3. The cord retractor apparatus of claim 1 wherein the frame is a housing.

4. The cord retractor apparatus of claim 3 wherein the housing includes a mounting wall supporting the spaced sidewalls and having a planar upper surface for engagement with the underside of a table.

5. The cord retractor apparatus of claim 4 wherein the housing includes a hinged cover substantially parallel to and spaced from the mounting wall, said hinged cover allowing access to components within the housing.

6. The cord retractor apparatus of claim 4 wherein the mounting wall includes at least one securing member for engagement with the underside of a table.

7. The cord retractor apparatus of claim 6 wherein at least one securing member is a planar adherence member.

8. The cord retractor apparatus of claim 7 wherein the planar adherence member is a hook-and-loop-type member.

9. The cord retractor apparatus of claim 1 wherein the retractable pull tether is a tether box at the second end of the frame.

10. The cord retractor apparatus of claim 1 wherein the cord manager includes a clamp to clamp the proximal end portion of the cord and a guide aperture adjacent thereto through which the distal end portion passes.

* * * * *